United States Patent [19]

Makino et al.

(10) Patent No.: US 11,249,152 B2
(45) Date of Patent: *Feb. 15, 2022

(54) MAGNETIC FIELD DETECTION DEVICE AND METHOD OF DETECTING MAGNETIC FIELD

(71) Applicant: TDK Corporation, Tokyo (JP)

(72) Inventors: Kenzo Makino, Tokyo (JP); Hiroshi Kiyono, Tokyo (JP)

(73) Assignee: TDK CORPORATION, Tokyo (JP)

( * ) Notice: Subject to any disclaimer, the term of this patent is extended or adjusted under 35 U.S.C. 154(b) by 95 days.

This patent is subject to a terminal disclaimer.

(21) Appl. No.: 16/786,302

(22) Filed: Feb. 10, 2020

(65) Prior Publication Data

US 2020/0300944 A1 Sep. 24, 2020

(30) Foreign Application Priority Data

Mar. 20, 2019 (JP) .............................. JP2019-053450

(51) Int. Cl.
*G01R 33/09* (2006.01)
*G01R 33/00* (2006.01)

(52) U.S. Cl.
CPC ....... *G01R 33/098* (2013.01); *G01R 33/0041* (2013.01)

(58) Field of Classification Search
CPC .................... G01R 33/0041; G01R 33/098
See application file for complete search history.

(56) References Cited

U.S. PATENT DOCUMENTS

| 7,915,891 | B2 | 3/2011 | Edelstein | |
| 8,164,861 | B2* | 4/2012 | Braganca | G01R 33/1284 360/313 |
| 10,175,307 | B1* | 1/2019 | Sorenson | G01R 33/0286 |
| 2020/0200838 | A1* | 6/2020 | Kiyono | G01R 33/0094 |
| 2020/0209325 | A1* | 7/2020 | Makino | G01R 33/09 |

FOREIGN PATENT DOCUMENTS

JP H11-101891 A 4/1999

* cited by examiner

*Primary Examiner* — Reena Aurora
(74) *Attorney, Agent, or Firm* — Oliff PLC

(57) ABSTRACT

A magnetic field detection device includes a magnetism detection element, a modulator, and a demodulator. The magnetism detection element has a sensitivity axis along a first direction. The modulator is configured to impart a spin torque to the magnetism detection element. The spin torque has a rotational force and oscillates at a first frequency. The rotational force is exerted on a plane including the first direction and a second direction orthogonal to the first direction. The demodulator is configured to demodulate an output signal received from the magnetism detection element and to detect an intensity of a measurement target magnetic field exerted on the magnetism detection element on the basis of an amplitude of the output signal. The output signal has the first frequency.

12 Claims, 14 Drawing Sheets

MAGNETIC FIELD DETECTION DEVICE AND METHOD OF DETECTING MAGNETIC FIELD

CROSS REFERENCE TO RELATED APPLICATIONS

This application claims the benefit of Japanese Priority Patent Application No. 2019-053450 filed on Mar. 20, 2019, and the entire contents of which are incorporated herein by reference.

BACKGROUND

The technology relates to a magnetic field detection device including a magnetism detection element, and a method of detecting a magnetic field by use of the magnetism detection element.

A magneto-resistive sensor has been proposed that applies an alternating magnetic field to a giant magneto-resistive element to achieve high resolution for detecting an external magnetic field. Reference is made to Japanese Unexamined Patent Application Publication No. H11-101861. Further, a micro-electro-mechanical system (MEMS) has been proposed that has such a structure that causes magnetic fluxes to concentrate on a magnetic sensor. Reference is made to U.S. Pat. No. 7,915,891.

SUMMARY

A magnetic field detection device according to one embodiment of the technology includes a magnetism detection element, a modulator, and a demodulator. The magnetism detection element has a sensitivity axis along a first direction. The modulator is configured to impart a spin torque to the magnetism detection element.

The spin torque has a rotational force and oscillates at a first frequency. The rotational force is exerted on a plane including the first direction and a second direction orthogonal to the first direction. The demodulator is configured to demodulate an output signal received from the magnetism detection element and to detect an intensity of a measurement target magnetic field exerted on the magnetism detection element on the basis of an amplitude of the output signal. The output signal has the first frequency.

A method of detecting a magnetic field according to one embodiment of the technology includes imparting a spin torque to a magnetism detection element having a sensitivity axis along a first direction; and detecting an intensity of a measurement target magnetic field exerted on the magnetism detection element on the basis of an amplitude of an output signal outputted from the magnetism detection element and having the first frequency. The spin torque has a rotational force and oscillates at a first frequency. The rotational force is exerted on a plane including the first direction and a second direction orthogonal to the first direction.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1A:
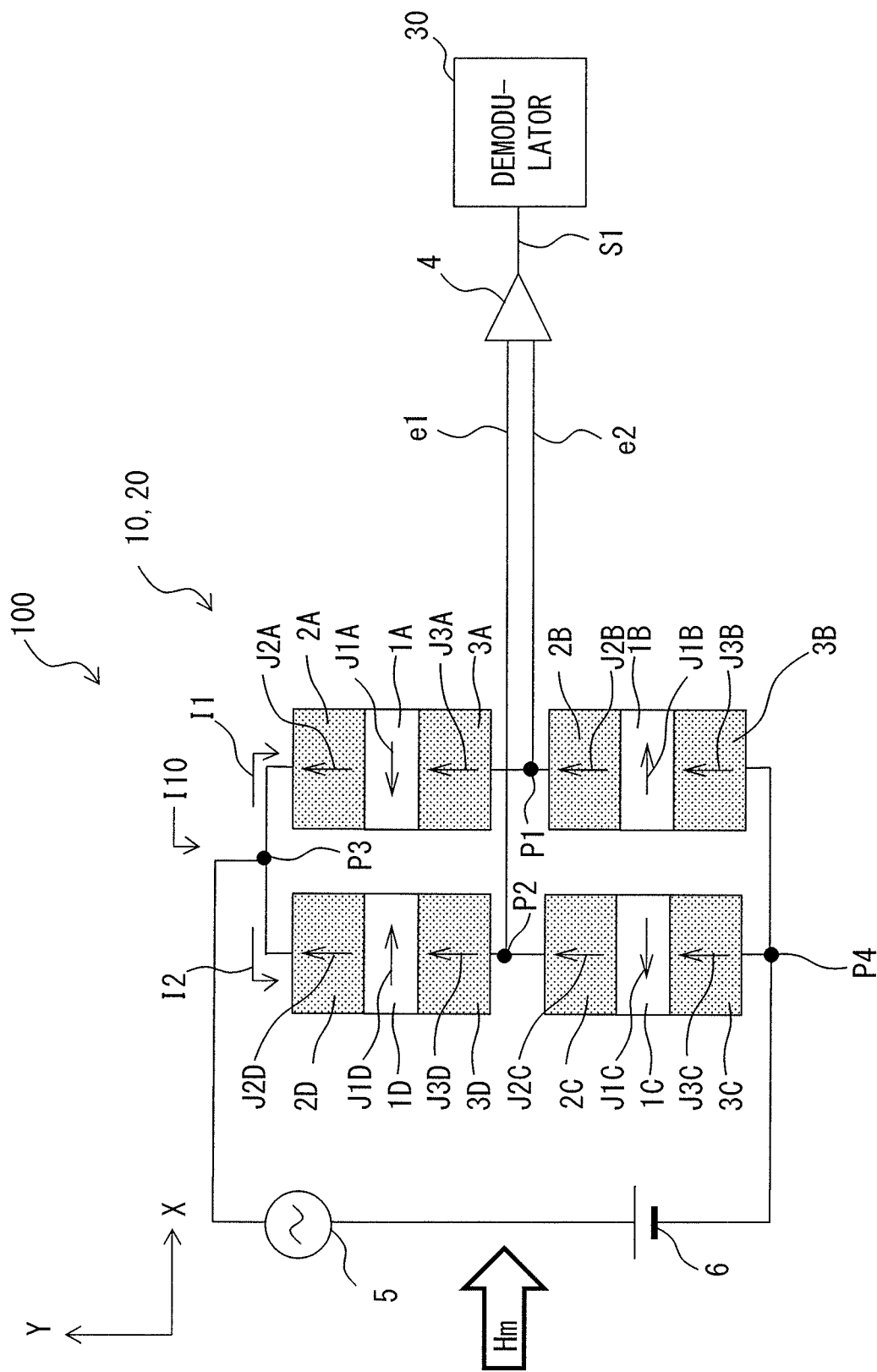
FIG. 1A is a schematic diagram illustrating an example overall configuration of a magnetic field detection device according to one embodiment of the technology.

There is a demand for a magnetic field detection device with higher resolution for detecting a magnetic field.

It is desirable to provide a magnetic field detection device with higher detection resolution and a method of detecting magnetic field with higher detection resolution.

In the following, some example embodiments and modification examples of the technology are described in detail, in the following order, with reference to the accompanying drawings. Note that the following description is directed to illustrative examples of the technology and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Note that the like elements are denoted with the same reference numerals, and any redundant description thereof will not be described in detail. Note that the description is given in the following order.

1. First Embodiment (Example Magnetic Field Detection Device Provided with Demodulator Including High-pass Filter and Phase Detecting Circuit)
2. Second Embodiment (Example Magnetic Field Detection Device Provided with Demodulator Including High-pass Filter and Sample and Hold Circuit)
3. Modification Examples 1. First Embodiment

[Example Configuration of Magnetic Field Detection device 100]

FIG. 1A is a schematic diagram illustrating an example overall configuration of a magnetic field detection device 100 according to a first embodiment of the technology. The magnetic field detection device 100 includes a magnetism detector 10, a modulator 20, and a demodulator 30.

[Magnetism Detector 10]

The magnetism detector 10 may include four magnetism detection elements 1 (1A to 1D), for example. The magnetism detection elements 1A to 1D may be coupled in bridge connection to form a bridge circuit. The magnetism detection elements 1A to 1D may each have a sensitivity axis extending in an X-axis direction. The magnetism detection elements 1A to 1D may be magneto-resistive elements, for example. In an example in which the magnetism detection elements 1A to 1D are magneto-resistive elements, a magnetization fixed layer (pinned layer) 13 in each of the magneto-resistive elements may have magnetization substantially parallel to the sensitivity axis.

For example, the magnetism detection element 1A may include the magnetization fixed layer 13 (described below) having magnetization J1A oriented in a −X direction, the magnetism detection element 1B may include a magnetization fixed layer 13 having magnetization J1B oriented in a +X direction, the magnetism detection element 1C may include a magnetization fixed layer 13 having magnetization J1C oriented in the −X direction, and the magnetism detection element 1D may include a magnetization fixed layer 13 having magnetization J1D oriented in the +X direction.

Figure 1B:
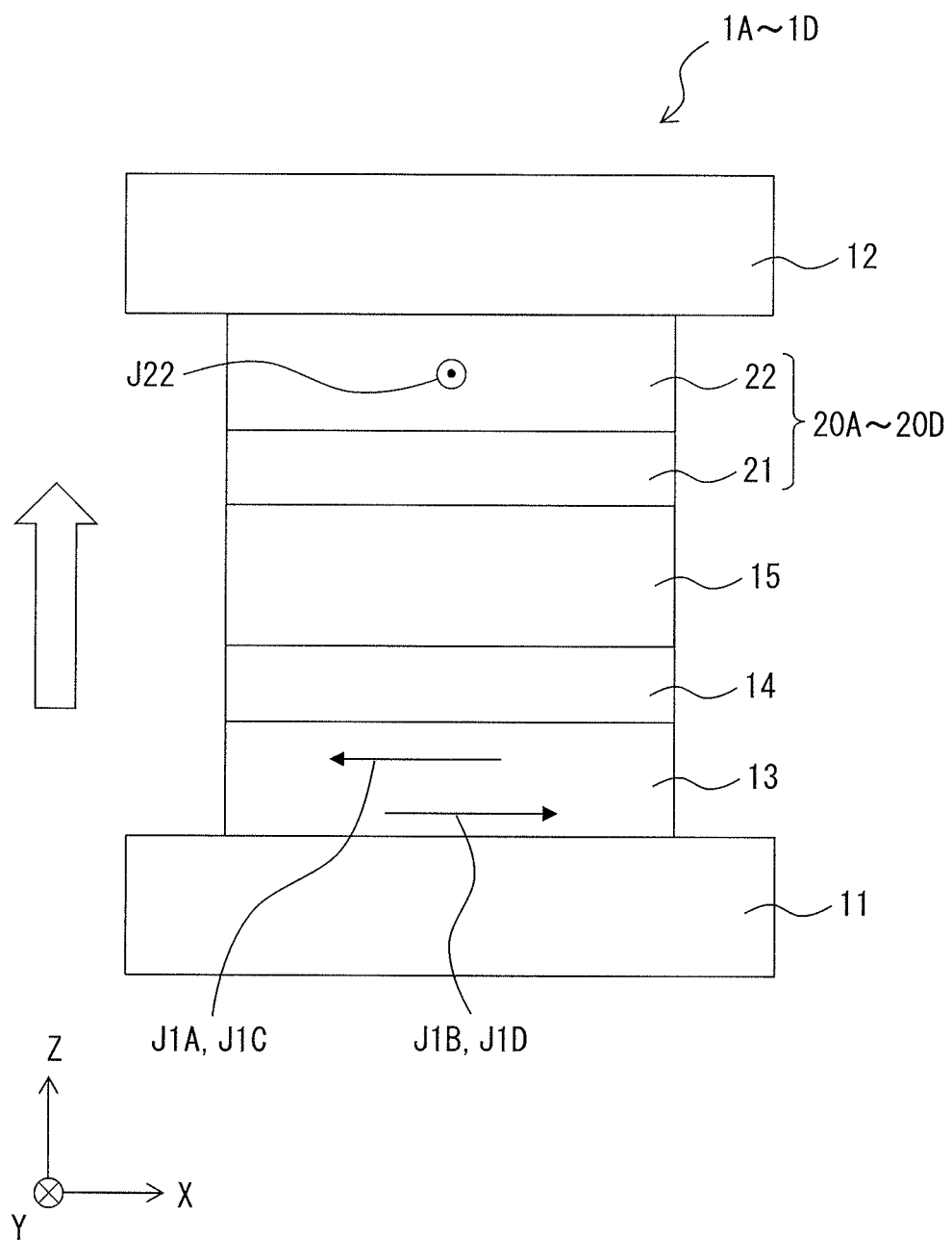
FIG. 1B is a schematic diagram illustrating an example cross-sectional configuration of a magnetism detection element in the magnetic field detection device illustrated in FIG. 1A.

FIG. 1B is a schematic diagram illustrating an example cross-sectional configuration of the magnetism detection elements 1A to 1D. As illustrated in FIG. 1B, the magnetism detection elements 1A to 1D may each include a first electrode layer 11, a second electrode layer 12, and a magnetization fixed layer 13, a first nonmagnetic layer 14, and a magnetization free layer 15. The magnetization fixed layer 13, the first nonmagnetic layer 14, and the magnetization free layer 15 may be provided between the first electrode layer 11 and the second electrode layer 12 and laminated in order from the first electrode layer 11 toward the second electrode layer 12. A second nonmagnetic layer 21 and a spin injection layer 22 may be provided between the magnetization free layer 15 and the second electrode layer 12 and laminated in order from the magnetization free layer 15 toward the second electrode layer 12. The second nonmagnetic layer 21 and the spin injection layer 22 may constitute a modulator 20 (20A to 20D). The modulator 20 will be described in detail below. In the magnetism detection elements 1A to 1D, an electric current may flow from the first electrode layer 11 to the second electrode layer 12.

The magnetism detector 10 may further include permanent magnets 2A to 2D and permanent magnets 3A to 3D. The permanent magnets 2A and 3A may be disposed opposed to each other across the magnetism detection element 1A. The permanent magnets 2A and 3A may have respective magnetization J2A and J3A. The magnetization J2A and J3A may be oriented in a direction orthogonal to the magnetization J1A, such as a +Y direction. The permanent magnets 2B and 3B may be disposed opposed to each other across the magnetism detection element 1B. The permanent magnets 2B and 3B may have respective magnetization J2B and J3B. The magnetization J2B and J3B may be oriented in the +Y direction orthogonal to the magnetization J1B. The permanent magnets 2C and 3C may be disposed opposed to each other across the magnetism detection element 1C. The permanent magnets 2C and 3C may have respective magnetization J2C and J3C. The magnetization J2C and J3C may be oriented in the +Y direction orthogonal to the magnetization J1C. The permanent magnets 2D and 3D may be disposed opposed to each other across the magnetism detection element 1D. The permanent magnets 2D and 3D may have respective magnetization J2D and J3D. The magnetization J2D and J3D may be oriented in the +Y direction orthogonal to the magnetization J1D. Such a configuration may allow the permanent magnets 2A to 2D and 3A to 3D to apply a bias magnetic field oriented in the +Y direction to the respective magnetism detection elements 1A to 1D. Note that the permanent magnets 2A to 2D and 3A to 3D may each correspond to a specific but non-limiting example of a "bias magnetic field imparting member" according to one embodiment of the technology.

In the bridge circuit in the magnetism detector 10, a first end of the magnetism detection element 1A and a first end of the magnetism detection element 1B may be coupled at a node P1, and a first end of the magnetism detection element 1C and a first end of the magnetism detection element 1D may be coupled at a node P2. Additionally, a second end of the magnetism detection element 1A and a second end of the magnetism detection element 1D may be coupled at a node P3, and a second end of the magnetism detection element 1B and a second end of the magnetism detection element 1C may be coupled at a node P4. An alternating-current (AC) power 5 and a direct-current (DC) power 6 may be coupled to the nodes P3 and P4. The nodes P1 and P2 may be coupled to an input terminal of a differential detector 4. The differential detector 4 may output, to the demodulator 30, a differential signal 51 that corresponds to a potential difference between the node P1 and the node P2 at the time of application of a bias application voltage to the nodes P3 and P4.

[Modulator 20]

With reference to FIG. 1B, the modulators 20 (20A to 20D) may be incorporated in the respective magnetism detection elements 1A to 1D, and may each have the second nonmagnetic layer 21 and the spin injection layer 22. The spin injection layer 22 may include cobalt-iron alloy (CoFe), for example, and may have magnetization J22 oriented in the −Y direction that is opposite to the direction of the bias magnetic field imparted by the permanent magnets 2A to 2D and 3A to 3D.

The AC power 5 and the DC power 6 may supply a bias application current to the modulator 20 (20A to 20D) to generate a spin torque that weakens the intensity of the bias magnetic field oriented in the +Y direction and exerted on each of the magnetism detection elements 1A to 1D. Such a spin torque may modulate the sensitivity of each of the magnetism detection elements 1A to 1D. The term "bias application current" used herein may refer to a current including a bias component and a vibrational component. Applying the bias application current to the magnetism detection elements 1A to 1D may generate a spin torque having an intensity that periodically varies (e.g., oscillates at a first frequency). The spin torque may have a rotational force exerted on the X-Y plane including the X-axis direction and the Y-axis direction.

[Demodulator 30]

Figure 2:
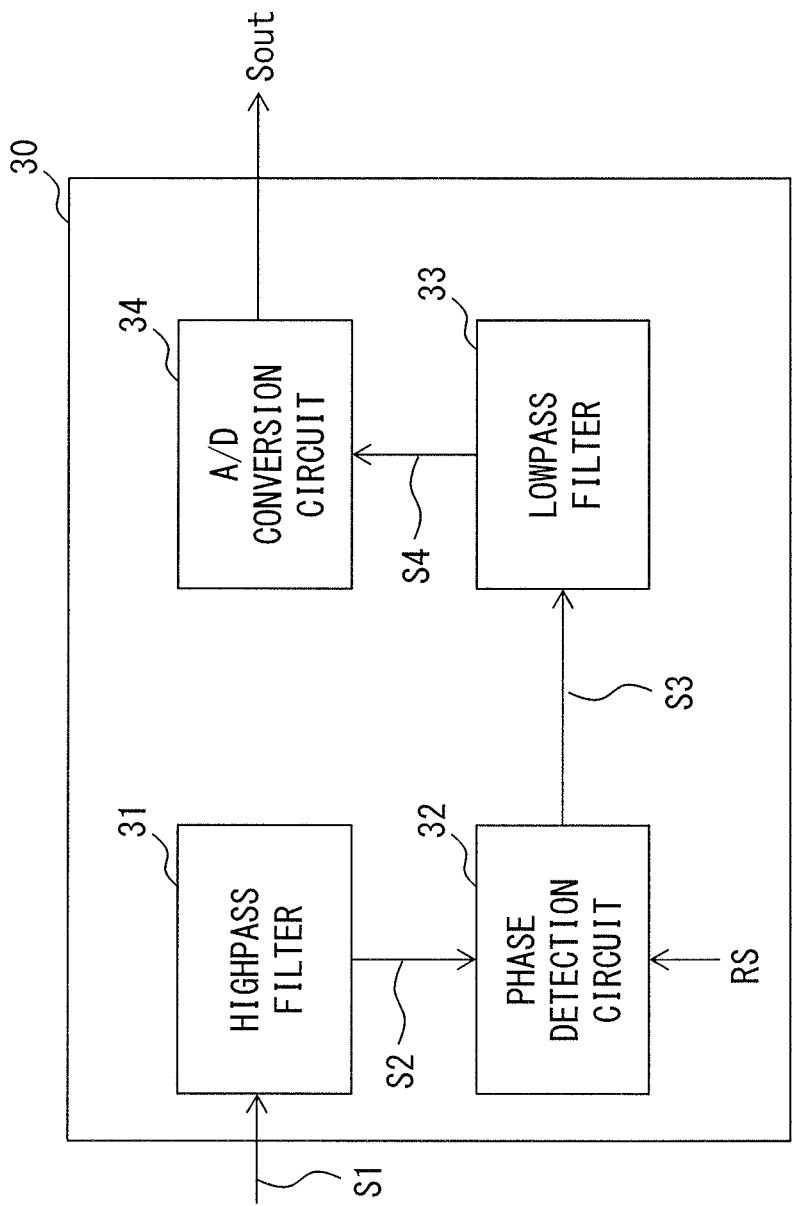
FIG. 2 is a block diagram illustrating an example configuration of a demodulator in the magnetic field detection device illustrated in FIG. 1A.

The demodulator 30 may demodulate an output signal with the first frequency (i.e., the differential signal S1) received from any of the magnetism detection elements 1A to 1D. The demodulator 30 may detect the intensity of a measurement target magnetic field Hm exerted on the magnetism detection elements 1A to 1D on the basis of the amplitude of the differential signal S1. Herein, the measurement target magnetic field Hm may refer to a magnetic field to be detected. An example configuration of the demodulator 30 will now be described in detail with reference to FIG. 2. FIG. 2 is a block diagram illustrating the example configuration of the demodulator 30.

As illustrated in FIG. 2, the demodulator 30 may include a high-pass filter 31, a phase detection circuit 32, a lowpass filter 33, and an analog/digital (A/D) conversion circuit 34 in order from upstream to downstream. In one embodiment, the A/D conversion circuit 34 corresponds to a specific but non-limiting example of an "analog-digital converter".

The high-pass filter 31 may pass a frequency component having a second frequency or higher and output an output signal S2 to the phase detection circuit 32. Note that the second frequency may be lower than the first frequency. In one example where the first frequency is 1 kHz, the second frequency may be 500 Hz.

The phase detection circuit 32 may refer to a reference signal RS to obtain a phase detection signal S3 from the output signal S2 received from the high-pass filter 31. The reference signal RS may have a phase identical to the phase of the differential signal S1 outputted from any of the magnetism detection elements 1A to 1D and having the first frequency (e.g., 1 kHz). Additionally, the reference signal RS may be a square wave with the first frequency. The phase detection signal S3 may be sent to the lowpass filter 33.

The lowpass filter 33 may smooth a measurement target component in the phase detection signal S3 and output an output signal S4 to the A/D conversion circuit 34.

The A/D conversion circuit 34 may perform analog-digital (A/D) conversion on the output signal S4 including the measurement target component having been smoothed and passed through the lowpass filter 33. Thereafter, the A/D conversion circuit 34 may output an output signal Sout to the outside.

[Example Operations and Effects of Magnetic Field Detection device 100]

The magnetic field detection device 100 according to the first embodiment of the technology may detect the intensity of the measurement target magnetic field Hm exerted on the magnetism detection elements 1A to 1D. Since the magnetism detection elements 1A to 1D in the magnetic field detection device 100 each have improved resolution thanks to the modulator 20, it is possible to detect the magnetic field Hm with high accuracy even if the magnetic field Hm has a weaker intensity.

Figure 3:
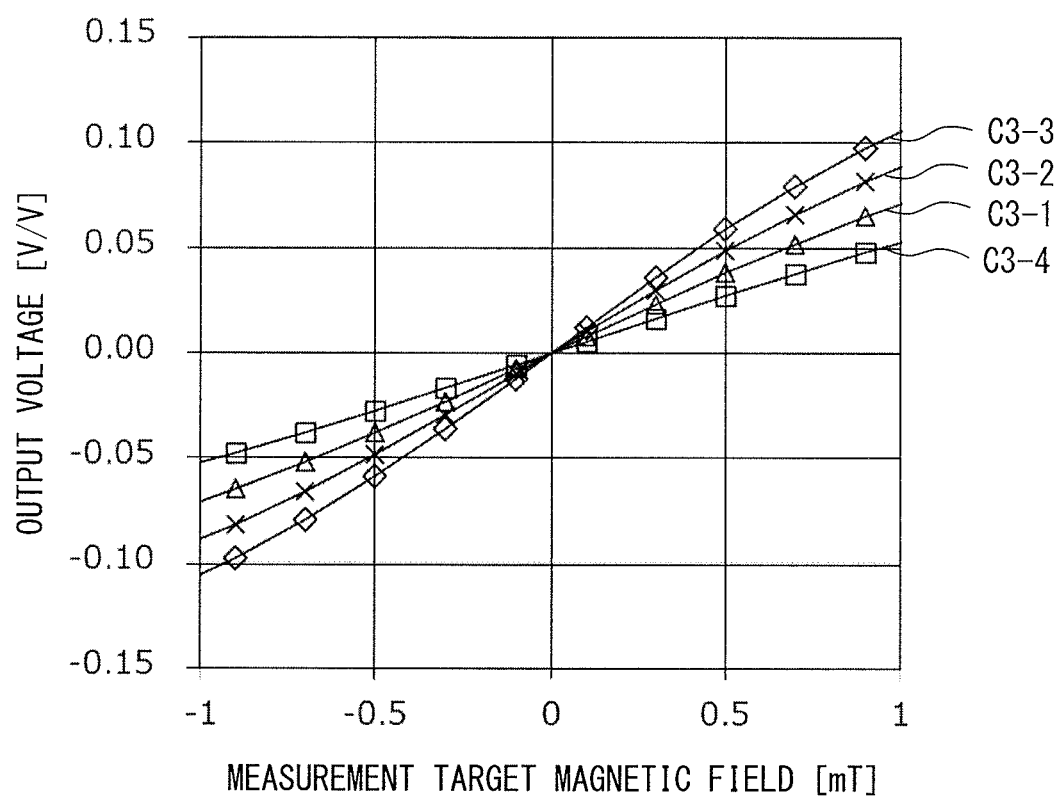
FIG. 3 is a characteristic diagram illustrating sensitivity modulation of the magnetism detection element.

FIG. 3 is a characteristic diagram illustrating sensitivity modulation of the magnetism detection elements 1A to 1D by the modulators 20A to 20D. FIG. 3 illustrates an output voltage [V/V] of the differential signal S1 per application voltage 1V (hereinafter simply referred to as an "output voltage [V/V]") when the measurement target magnetic field Hm in a range from −1 mT to +1 mT is applied along the X-axis direction while the bias application current is supplied from the AC power 5 and the DC power 6 to the modulators 20A to 20D to impart a spin torque to the magnetization free layer 15 in each of the magnetism detection elements 1A to 1D. FIG. 3 may have a horizontal axis representing the measurement target magnetic field Hm [mT] and a vertical axis representing the output voltage [V/V]. FIG. 3 illustrates a relation between the measurement target magnetic field Hm and the output voltage [V/V] when a spin torque is imparted to the magnetization free layer 15 in each of the magnetism detection elements 1A to 1D. In FIG. 3, a curve C3-1 represents a characteristic of an output voltage of the magnetism detector 10 when a spin torque is generated by flowing a reference current A [per arbitrary unit] from the first electrode layer 11 to the second electrode layer 12. Likewise, a curve C3-2 represents a characteristic of an output voltage of the magnetism detector 10 when a spin torque is generated by flowing a current 1.5 A [per arbitrary unit], which is 1.5 times the reference current A represented by the curve C3-1, from the first electrode layer 11 to the second electrode layer 12. A curve C3-3 represents a characteristic of an output voltage of the magnetism detector 10 when a spin torque is generated by flowing a current 2 A [per arbitrary unit], which is twice the reference current A represented by the curve C3-1, from the first electrode layer 11 to the second electrode layer 12. A curve C3-4 represents a characteristic of an output voltage of the magnetism detector 10 when a spin torque is generated by flowing a current 0.5 A [per arbitrary unit], which is 0.5 times the reference current A represented by the curve C3-1, from the first electrode layer 11 to the second electrode layer 12. The intensity of the spin torque generated may increase with an increase in an AC current flowing in each of the modulators 20A to 20D. In this example, the magnetization J22 of the spin injection layer 22 may be oriented in the −Y direction that is opposite to the +Y direction in which the bias magnetic fields generated by the permanent magnets 2A to 2D and 3A to 3D are oriented. Therefore, the higher intensity the spin torque has, the greater effect that weakens the bias magnetic field imparted to the magnetism detection elements 1A to 1D may be obtained. Additionally, in FIG. 3, the measurement target magnetic field Hm taking a positive value may correspond to the measurement target magnetic field Hm applied to the magnetism detection elements 1A to 1D in substantially the same direction as the magnetization J1B and J1D (e.g., the +X direction in the example illustrated in FIG. 1), and the measurement target magnetic field Hm taking a negative value may correspond to the measurement target magnetic field Hm applied to the magnetism detection elements 1A to 1D in substantially the same direction as the magnetization J1A and J1C (e.g., the −X direction in the example illustrated in FIG. 1).

As apparent from FIG. 3, the output voltage [V/V] of each of the magnetism detection elements 1A to 1D varies depending on the magnitude of the current supplied to each of the magnetism detection elements 1A to 1D, i.e., depending on the magnitude of the spin torque imparted to the magnetization free layer 15 in each of the magnetism detection elements 1A to 1D. Given that the curve C3-1 that represents the case of flowing the current A is a reference, an absolute value of the output voltage [V/V] may increase as the current value increases as in the curves C3-2 and C3-3, i.e., as the intensity of the generated spin torque increases. In contrast, the absolute value of the output voltage [V/V] may decrease as the current value decreases as in the curve C3-4, i.e., as the intensity of the generated spin torque decreases. Therefore, the sensitivity of the magnetism detection elements 1A to 1D to detect the measurement target magnetic field Hm may be improved by increasing the value of a current flowing in the respective magnetism detection elements 1A to 1D, i.e., by increasing the intensity of the spin torque imparted to the magnetization free layer 15 in each of the magnetism detection elements 1A to 1D.

Figure 4:
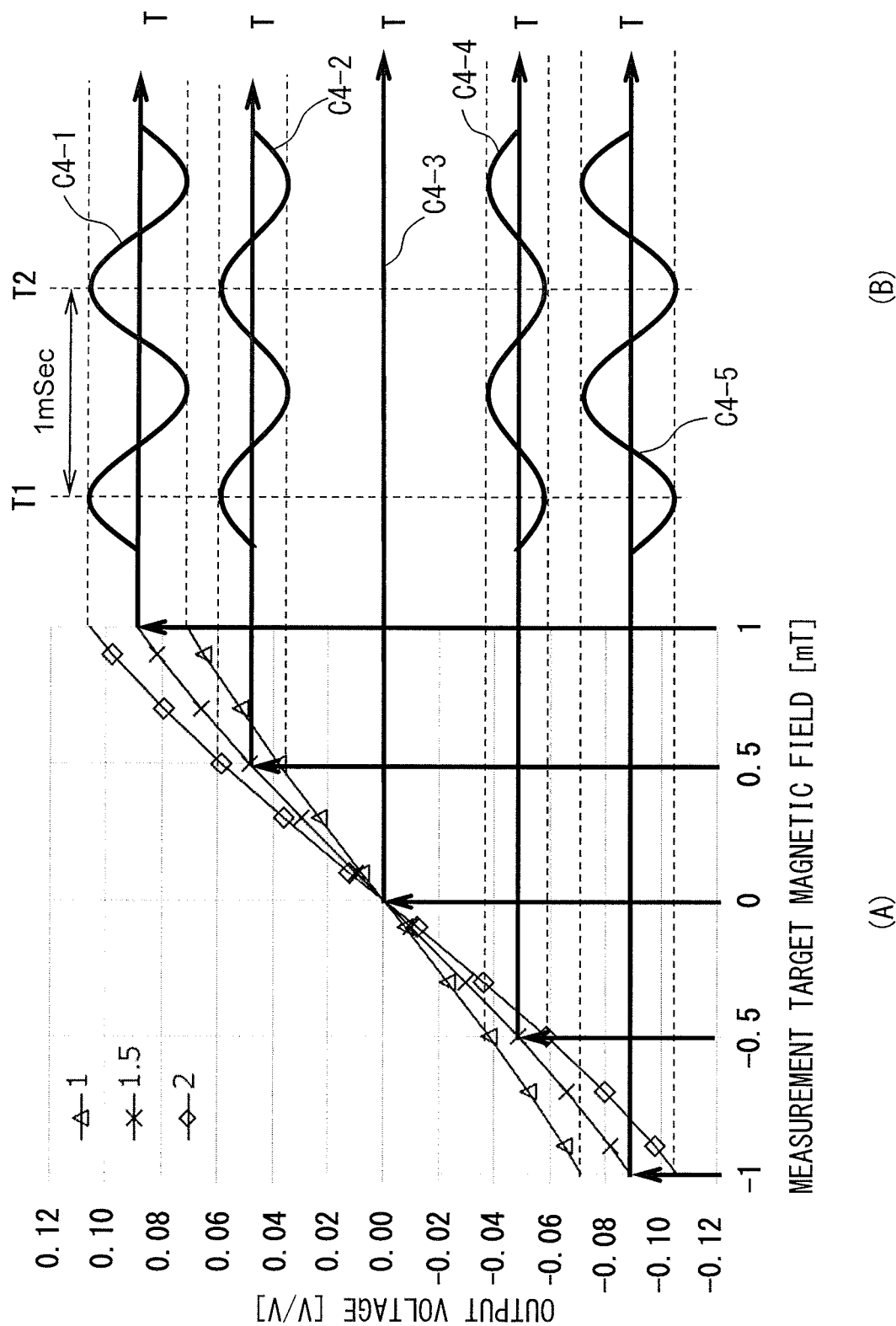
FIG. 4 is a characteristic diagram illustrating an example relation of an output from a magnetism detector including a magnetism detection element having sensitivity modulated by a spin torque imparted to the magnetism detection element, with a measurement target magnetic field applied to the magnetism detection element.

As described above, the magnetism detection elements 1A to 1D may undergo sensitivity modulation depending on the intensity of the spin torque imparted thereto. When the spin torque is imparted to each of the magnetism detection elements 1A to 1D while the measurement target magnetic field Hm of a predetermined value is applied, an output voltage from the magnetism detector 10 may periodically vary, as illustrated in FIG. 4. FIG. 4 is a characteristic diagram illustrating a relation of the output voltage from the magnetism detector 10 including the magnetism detection elements 1A to 1D each having sensitivity modulated by the spin torque imparted to each of the magnetism detection elements 1A to 1D, with the measurement target magnetic field Hm applied to the magnetism detection elements 1A to 1D. In this example, the spin torque may oscillate at the first frequency.

Part (A) of FIG. 4 illustrates the output voltage [V/V] of the differential signal S1 per application voltage 1V (hereinafter simply referred to as output voltage [V/V]) when the measurement target magnetic field Hm in a range from −1 mT to +1 mT is applied along the X-axis direction while a spin torque is imparted to each of the magnetism detection elements 1A to 1D. Note that the differential signal S1 may be obtained by applying a predetermined bias application voltage from the AC power 5 and the DC power 6 to between the node P3 and the node P4 of the bridge circuit including the magnetism detection elements 1A to 1D, and detecting, with the differential detector 4, a difference between a signal e1 and a signal e2 that are obtained from the respective nodes P1 and P2 of the bridge circuit. In Part (A) of FIG. 4, a horizontal axis represents the measurement target magnetic field Hm [mT], and a vertical axis represents the output voltage [V/V]. Additionally, Part (A) of FIG. 4 illustrates a relation between the output voltage [V/V] and the measurement target magnetic field Hm for each of three current levels including 1.0 A [arbitrary unit], 1.5 A [arbitrary unit], and 2.0 A [arbitrary unit].

Part (B) of FIG. 4 illustrates temporal changes in the output voltage [V/V] from the magnetism detector 10 per application voltage 1V (hereinafter simply referred to as output voltage [V/V]) when the magnetism detection elements 1A to 1D are supplied with spin torques generated by flowing currents at three levels including 1.0 A [arbitrary unit], 1.5 A [arbitrary unit], and 2.0 A [arbitrary unit] while the measurement target magnetic fields Hm at five levels including +1.0 mT, +0.5 mT, 0 mT, −0.5 mT, and −1.0 mT are applied. In Part (B) of FIG. 4, a horizontal axis represents time T, and a vertical axis represents the output voltage [V/V] of the differential signal S1. Part (B) of FIG. 4 illustrates an example case where a current that oscillates at 1 kHz is flown, i.e., where one cycle from a timing T1 to a timing T2 is one millisecond. A curve C4-1 of Part (B) of FIG. 4 represents a characteristic of the output voltage [V/V] upon application of the measurement target magnetic field Hm of 1.0 mT to the magnetism detection elements 1A to 1D, a curve C4-2 represents a characteristic of the output voltage [V/V] upon application of the measurement target magnetic field Hm of +0.5 mT to the magnetism detection elements 1A to 1D, a curve C4-3 represents a characteristic of the output voltage [V/V] upon application of the measurement target magnetic field Hm of 0 mT to the magnetism detection elements 1A to 1D, a curve C4-4 represents a characteristic of the output voltage [V/V] upon application of the measurement target magnetic field Hm of −0.5 mT to the magnetism detection elements 1A to 1D, and a curve C4-5 represents a characteristic of the output voltage [V/V] upon application of the measurement target magnetic field Hm of −1.0 mT to the magnetism detection elements 1A to 1D.

As apparent from FIG. 4, the output voltage [V/V] from the magnetism detector 10 per application voltage 1V may periodically vary when a current is applied that oscillates under an environment where the measurement target magnetic field Hm at a predetermined level is applied. In this case, the variation width of the output voltage [V/V] may increase as an absolute value of the measurement target magnetic field Hm increases. It is also apparent from FIG. 4 that the phase of the output voltage [V/V] is reversed when the measurement target magnetic field Hm is applied in an opposite direction.

Figure 5A:
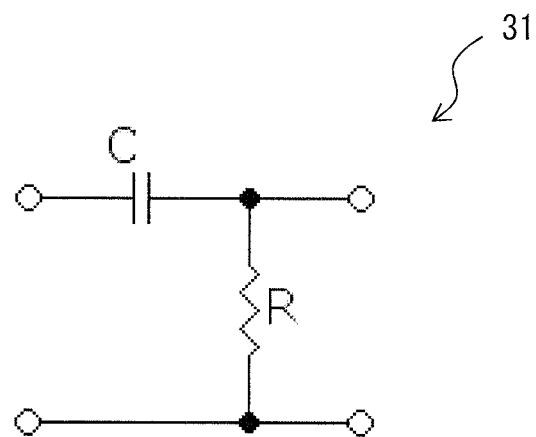
FIG. 5A is a circuit diagram illustrating an example circuit configuration of a high-pass filter illustrated in FIG. 2.
Figure 5B:
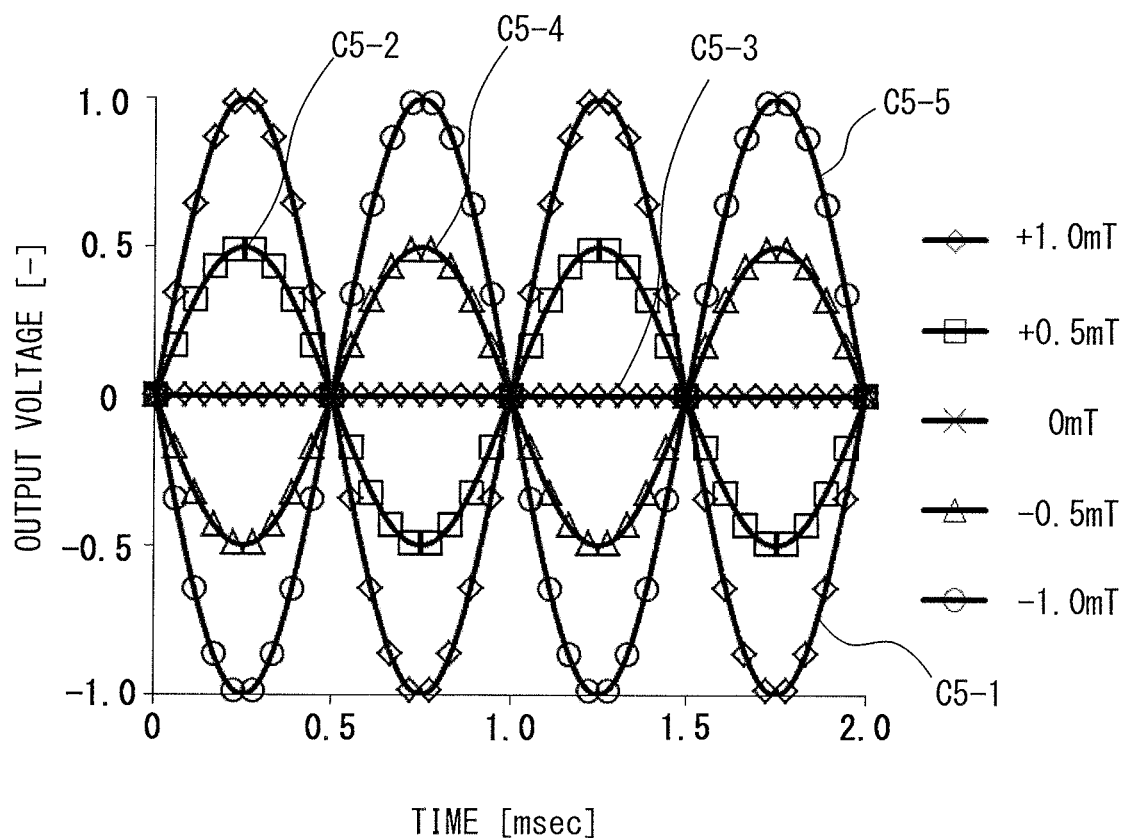
FIG. 5B is a characteristic diagram illustrating an example waveform of an output signal having passed through the high-pass filter illustrated in FIG. 5A and outputted from the magnetism detection element.

In the magnetic field detection device 100, the magnetism detector 10 may generate the differential signal S1, and thereafter, the high-pass filter 31 may remove frequency component lower than the second frequency (e.g., 500 Hz) from the differential signal S1 received from the magnetism detector 10. This allows for removal of 1/f noises or the frequency components lower than the second frequency (e.g., 500 Hz). FIG. 5A illustrates an example circuit configuration of the high-pass filter 31. FIG. 5B is a characteristic diagram illustrating an example waveform of the output signal S2 having passed through the high-pass filter 31. The waveform illustrated in FIG. 5B may correspond to a superposition of the curves C4-1 to C4-5 illustrated in Part (B) of FIG. 4. For example, curves C5-1 to C5-5 of FIG. 5B may respectively correspond to the curves C4-1 to C4-5 of Part (B) of FIG. 4. In FIG. 5B, a horizontal axis represents an elapsed time [msec.], and a vertical axis represents an output voltage [−]. The output voltage [−] along the vertical axis may be represented in arbitrary unit normalized with a maximum value of 1.

Figure 6A:
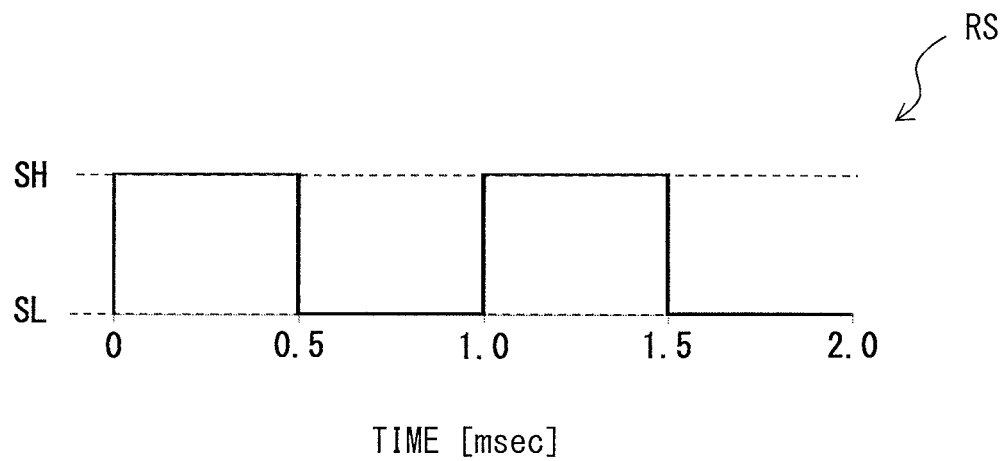
FIG. 6A is an example waveform of a reference signal transmitted to a phase detection circuit illustrated in FIG. 2.

In the magnetic field detection device 100, the high-pass filter 31 may generate the output signal S2, and thereafter, the phase detection circuit 32 may demodulate the output signal S2 referring to the reference signal RS illustrated in FIG. 6A, for example, to acquire the phase detection signal S3. FIG. 6A illustrates an example waveform of the reference signal RS transmitted to the phase detection circuit 32.

Figure 6B:
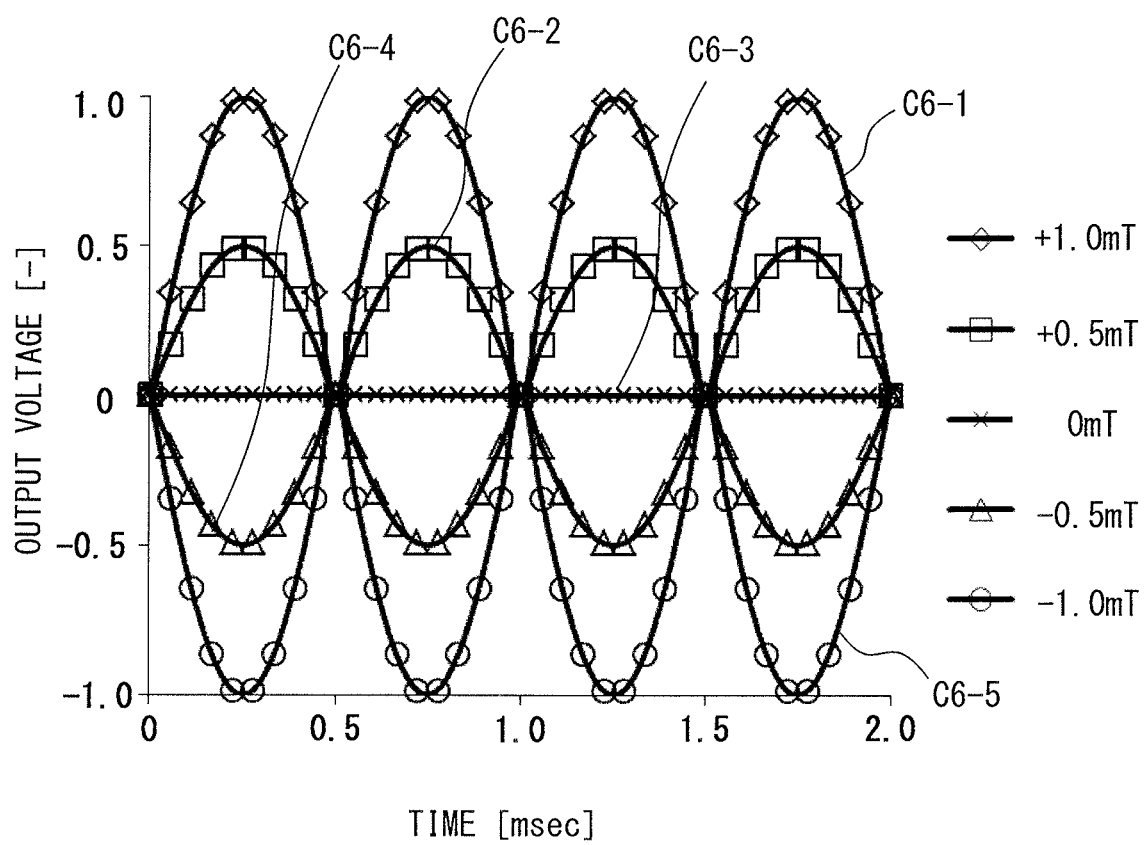
FIG. 6B is a characteristic diagram illustrating an example waveform of an output signal having passed through the phase detection circuit illustrated in FIG. 2 and outputted from the magnetism detection element.

The reference signal RS may have a wave cycle in synchronization with the wave cycle of the output signal S2 illustrated in FIG. 5B. For example, the reference signal RS may be a rectangular wave signal in which a value SH and a value SL are alternately repeated every 0.5 milliseconds, for example. In the first embodiment, when the reference signal RS takes the value SH, the phase detection circuit 32 may pass the output signal S2 without inverting the sign of the output voltage. In contrast, when the reference signal RS takes the value SL, the phase detection circuit 32 may pass the output signal S2 with inverting the sign of the output voltage. As a result, the phase detection signal S3 having a waveform illustrated in FIG. 6B, for example, may be obtained. FIG. 6B is a characteristic diagram illustrating an example waveform of the phase detection signal S3 having passed through the phase detection circuit 32. Curves C6-1 to C6-5 of FIG. 6B may respectively correspond to the curves C5-1 to C5-5 of FIG. 5B.

Figure 7:
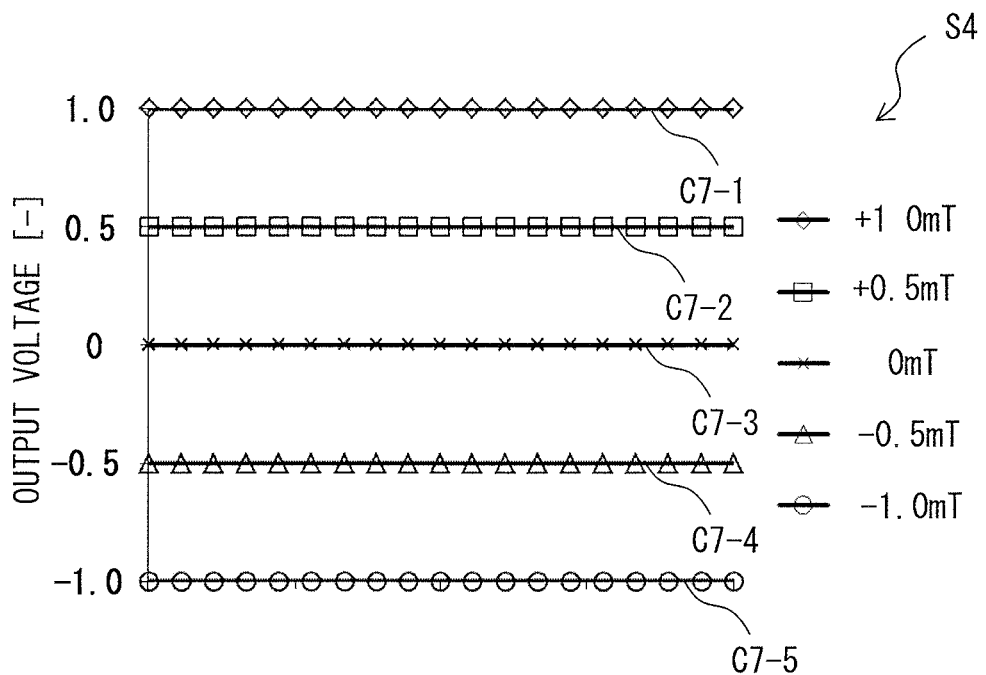
FIG. 7 is a characteristic diagram illustrating an example waveform of an output signal having passed through a lowpass filter illustrated in FIG. 2 and outputted from the magnetism detection element.

The lowpass filter 33 in the magnetic field detection device 100 may then retrieve measurement target components from the phase detection signal S3. As a result, the output signal S4 having a waveform illustrated in FIG. 7, for example, may be obtained. Curves C7-1 to C7-5 of FIG. 7 may respectively correspond to the curves C6-1 to C6-5 of FIG. 6B.

Figure 8:
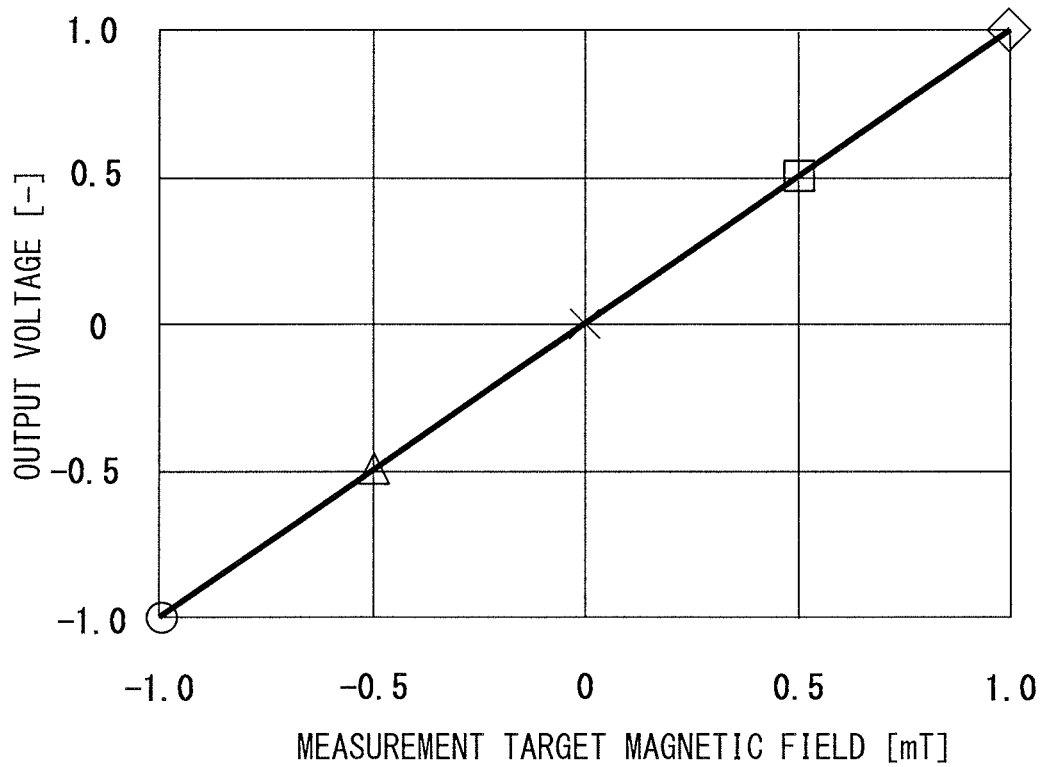
FIG. 8 is a characteristic diagram illustrating an example waveform of an output signal having passed through an A/D conversion circuit illustrated in FIG. 2 and outputted from the magnetism detection element.

The A/D conversion circuit 34 in the magnetic field detection device 100 may then perform A/D conversion on the output signal S4 including the measurement target components having been smoothed and passed through the lowpass filter 33, and may output an output signal Sout to the outside. FIG. 8 illustrates an example waveform of the output signal Sout having passed through the A/D conversion circuit 34. In FIG. 8, a horizontal axis represents the measurement target magnetic field [mT], and a vertical axis represents an output voltage [−]. As for the output signal Sout illustrated in FIG. 8, the output voltage [−] may be substantially in proportion to the measurement target magnetic field [mT] applied to the magnetism detection elements 1A to 1D.

[Example Effects of Magnetic Field Detection device 100]

As described above, the magnetism detection elements 1A to 1D in the magnetic field detection device 100 according to the first embodiment may undergo sensitivity modulation caused by imparting a spin torque from the modulator 20 including the spin injection layer 22 to the magnetization free layer 15. This causes the amplitude of the output voltage V from the magnetism detection elements 1A to 1D to change depending on the intensity of the measurement target magnetic field Hm, enabling the demodulator 30 to detect the intensity of the measurement target magnetic field Hm on the basis of the amplitude of the output voltage V. For example, a magnetic compass is often built in a mobile phone to measure the intensity of a measurement target magnetic field having a frequency of about 0 to about 100 Hz. Such a typical magnetic compass finds it difficult to have sufficient resolution due to an influence of a large 1/f noise generated in a magneto-resistive element at the frequency band within a range of about 0 to about 100 Hz. In contrast, according to the magnetic field detection device 100 and the method of detecting a magnetic field according to the first embodiment of the technology, it is possible to effectively remove the 1/f noise and achieve high resolution. Thus, according to the first embodiment, it is possible to achieve highly reproducible measurement of a magnetic field.

Figure 9:
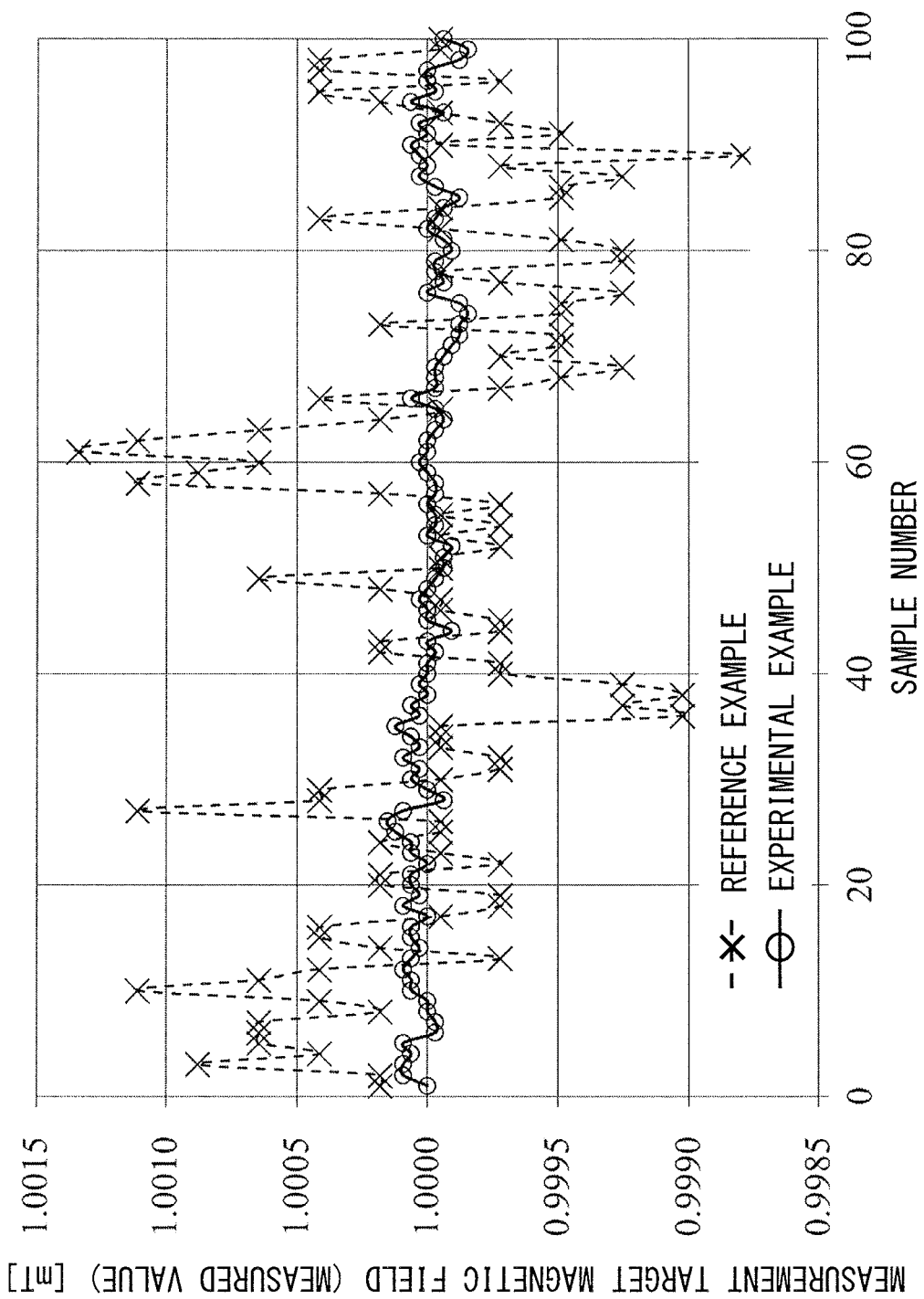
FIG. 9 is a characteristic diagram illustrating a comparison between measured values of a measurement target magnetic field detected by the magnetic field detection device illustrated in FIG. 1 and measured values of a measurement target magnetic field detected by a magnetic field detection device according to a reference example.

FIG. 9 illustrates variations in the values of the measurement target magnetic field Hm along the X-axis direction that were measured in an example experiment by use of the magnetic field detection device 100 according to the first embodiment. In FIG. 9, a horizontal axis represents a sample number, and a vertical axis represents a measured value of the measurement target magnetic field Hm. For purposes of comparison, the values of a measurement target magnetic field Hm of a reference example were also measured as illustrated in FIG. 9. A magnetic field detection device of the reference example did not include the modulator 20 and was not configured to apply a spin torque. Except this regard, the magnetic field detection device of the reference example had substantially the same configuration as the magnetic field detection device 100 of any of the embodiments of the technology. As apparent from FIG. 9, the variations in the measured values of the measurement target magnetic field Hm extended over a smaller range in the example experiment than in the reference example. Thus, higher resolution was achieved in the example experiment than in the reference example.

Further, according to the first embodiment, the sensitivity of the magnetism detection elements 1A to 1D is improved thanks to the modulator 20. This allows the measurement target magnetic field Hm to be detected with high accuracy even when the measurement target magnetic field Hm has a weaker intensity. Additionally, in the first embodiment, the sensitivity of the magnetism detection elements 1A to 1D may be modulated by imparting a spin torque without the use of a magnetic material that generates 1/f noises. This allows the magnetism detection elements 1A to 1D to detect the measurement target magnetic field Hm without hinderance. For example, in the technique disclosed in U.S. Pat. No. 7,915,891 described above, a member 40 that concentrates magnetic fluxes includes a magnetic material. The member 40 is thus likely to generate noises.

Further, according to the first embodiment, only frequency components demodulated at the phase detection circuit 32 on the basis of the reference signal RS may be eventually obtained, as the output signal Sout, from the output signal S2 having passed through the high-pass filter 31. This results in a high S/N ratio.

2. Second Embodiment

[Example Configuration of Demodulator 30A]

Figure 10:
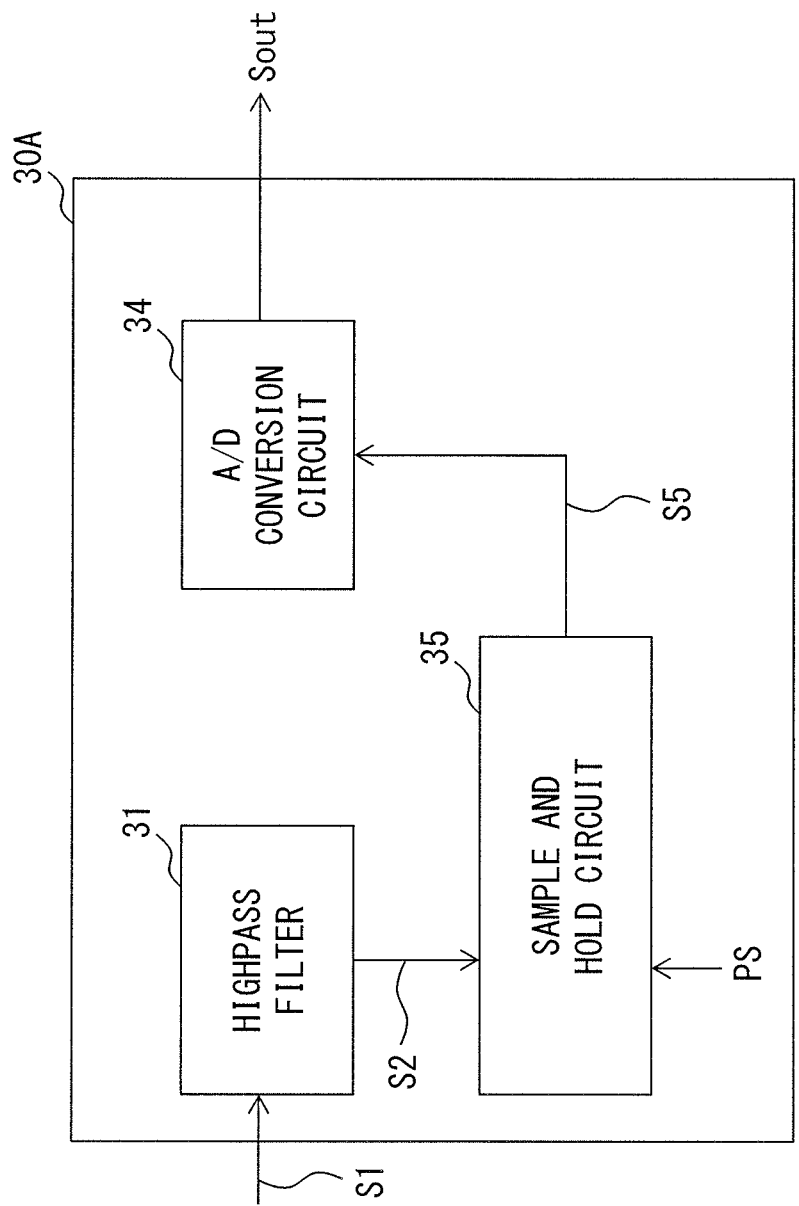
FIG. 10 is a block diagram illustrating an example configuration of a demodulator in the magnetic field detection device according to one embodiment of the technology.

FIG. 10 is a block diagram illustrating an example configuration of a demodulator 30A according to a second embodiment of the technology. Like the demodulator 30 of the first embodiment, the demodulator 30A may be installed in the magnetic field detection device 100, demodulate the differential signals 51 having undergone the sensitivity modulation at the modulator 20, and thereby help improve the S/N ratio.

As illustrated in FIG. 10, the demodulator 30A may include a sample and hold circuit 35 in place of the phase detection circuit 32 in the demodulator 30, and may not include the lowpass filter 33. Except this regard, the demodulator 30A may have substantially the same configuration as the demodulator 30.

Figure 11A:
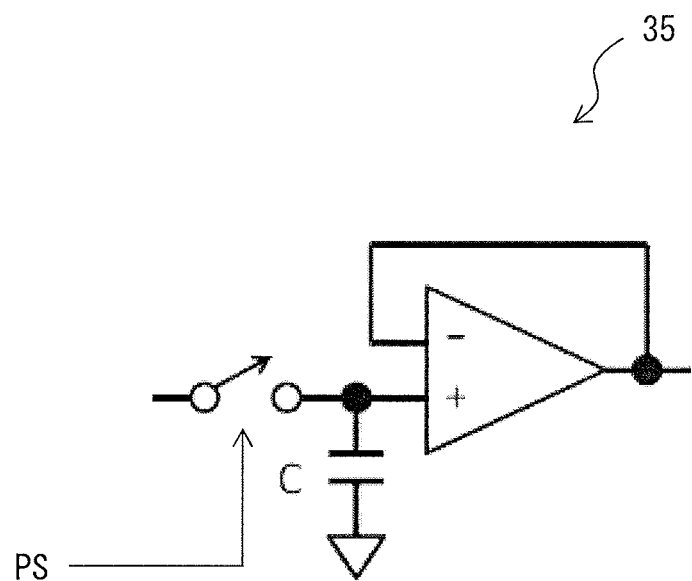
FIG. 11A is a diagram illustrating an example configuration of a sample and hold circuit illustrated in FIG. 10 and an example sample pulse signal transmitted to the sample and hold circuit.
Figure 11B:
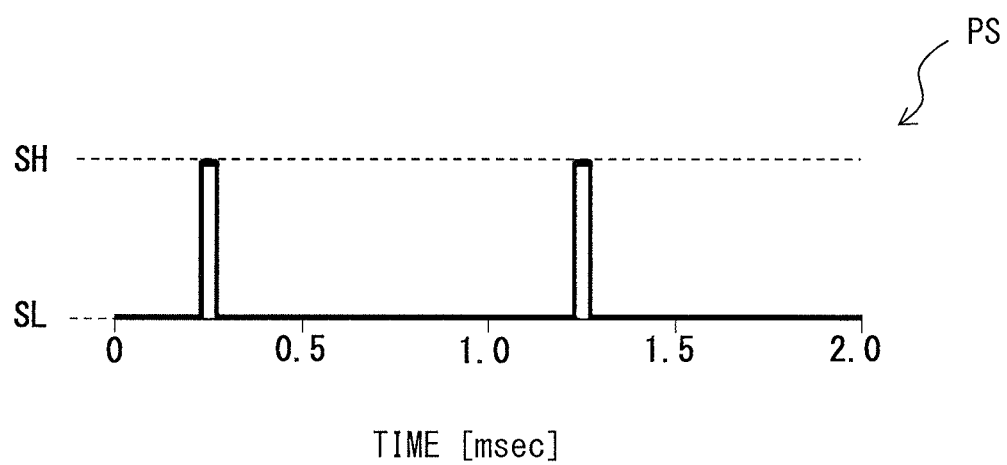
FIG. 11B is a characteristic diagram illustrating an example waveform of the sample pulse signal transmitted to the sample and hold circuit illustrated in FIG. 10.

FIG. 11A illustrates an example configuration of the sample and hold circuit 35. FIG. 11B is a characteristic diagram illustrating an example waveform of a sample pulse signal PS transmitted to the sample and hold circuit 35. The sample and hold circuit 35 may sample a peak value of the waveform of the output signal S2 illustrated in FIG. 5B referring to the sample pulse signals PS received from the outside of the sample and hold circuit 35, thereby demodulate the output signal S2, and obtain an output signal S5. The output signal S5 may have a waveform substantially the same as the output signal S4 illustrated in FIG. 7, for example.

The demodulator 30A may cause the A/D conversion circuit 34 to perform A/D conversion on the output signal S5 that includes sample components having passed through the sample and hold circuit 35, and output the output signal Sout to the outside. For example, the A/D conversion circuit 34 may perform A/D conversion involving time averaging process on the sample components to further suppress variations in the measured values of the measurement target magnetic field Hm.

[Example Workings and Effects of Demodulator 30A]

Like the demodulator 30 of the first embodiment, the demodulator 30A of the second embodiment may demodulate the differential signal S1 having undergone the sensitivity modulation at the modulator 20, and thereby help improve the S/N ratio.

[3. Modification Examples]

Although some embodiments of the technology are descried above, these are non-limiting examples and various modifications may be made. For example, although the phase detection circuit or the sample and hold circuit are described as examples of the demodulator in the foregoing embodiments, the demodulator of an embodiment of the technology should not be limited thereto. Additionally, although the demodulator includes the high-pass filter and the lowpass filter in at least one of the foregoing embodiments, these components may be omitted in another embodiment of the technology.

Figure 12:
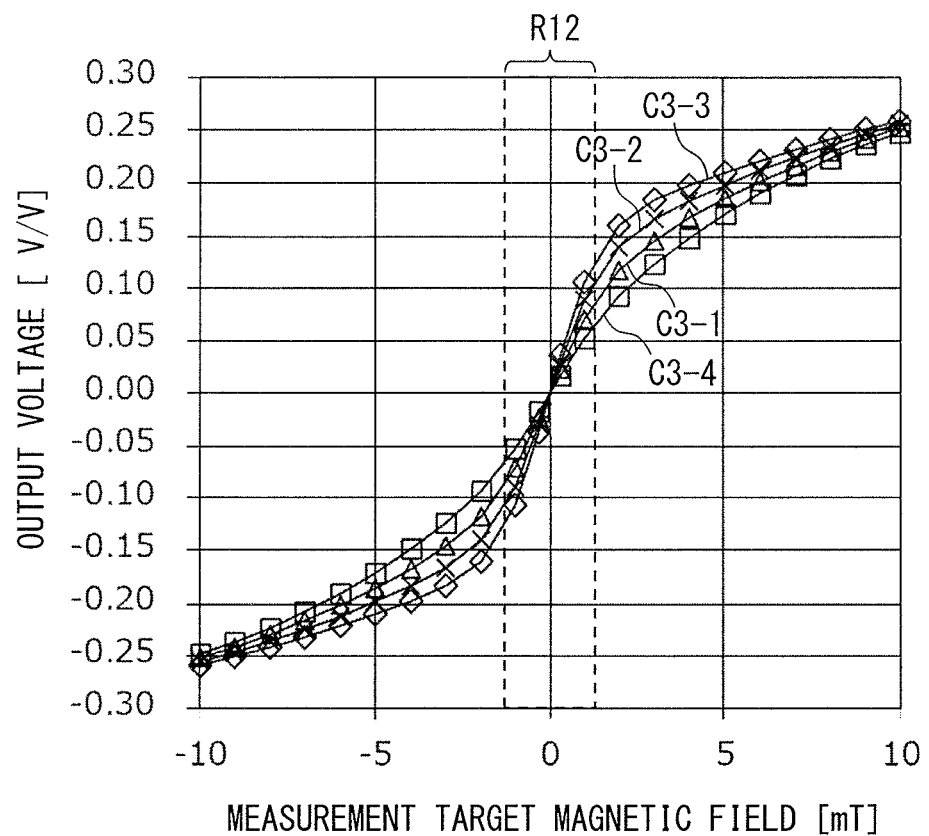
FIG. 12 is a characteristic diagram illustrating a measurable range of the magnetic field detection device illustrated in FIG. 1A.

In a case where the spin injection layer 22 in the magnetic field detection device 100 of the first embodiment has the magnetization J22 oriented in the −Y direction as illustrated in FIG. 1B, a spin transfer efficiency can decrease as the angle of the magnetization of the magnetization free layer 15 increases relative to a direction opposite to the direction of the magnetization J22 of the spin injection layer 22. Accordingly, as illustrated in FIG. 12, an increase in the external magnetic field (i.e., measurement target magnetic field) [mT] may become unproportional to an increase in the output voltage [V/V] per application voltage 1V (hereinafter simply referred to as output voltage [V/V]) after the external magnetic field (i.e., the measurement target magnetic field) reaches a large level to some extent. Thus, practically, the magnetic field detection device 100 may be used in a region in which the external magnetic field (i.e., measurement target magnetic field) [mT] is proportional to the output voltage [V/V], such as a measurable range R12 illustrated in FIG. 12. Note that curves C3-1 to C3-4 illustrated in FIG. 12 may be substantially the same as those illustrated in FIG. 3 except that the range of the external magnetic field [mT] differs between FIG. 3 and FIG. 12.

Figure 13:
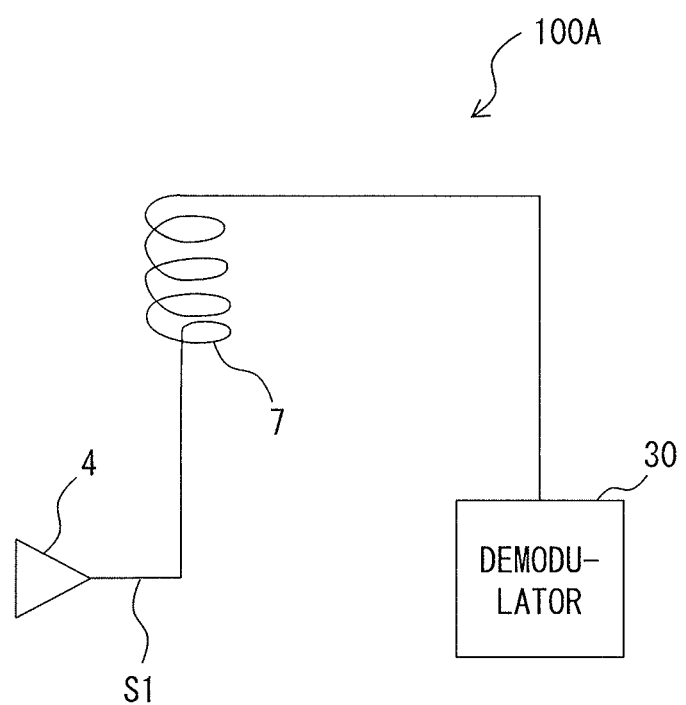
FIG. 13 is a schematic diagram illustrating a portion of the magnetic field detection device according to a modification example of the technology.

A magnetic field detection device 100A according to a modification example illustrated in FIG. 13 may include a feedback coil 7 between the differential detector 4 and the demodulator 30. The feedback coil 7 may draw a feedback current to enlarge the measurable range of the external magnetic field (i.e., the measurement target magnetic field). FIG. 13 is a schematic diagram illustrating some components of the magnetic field detection device 100A in an enlarged manner. The magnetic field detection device 100A may have substantially the same configuration as the magnetic field detection device 100 of the first embodiment except that the magnetic field detection device 100A includes the feedback coil 7.

A feedback current in proportion to the differential signal S1 may flow in the feedback coil 7 in the magnetic field detection device 100A. The feedback current flowing in the feedback coil 7 may be oriented in such a direction that cancels the measurement target magnetic field Hm applied to the magnetism detector 10. In one example, the feedback current may be controlled so that the magnetic field effectively applied to the magnetism detector 10 becomes approximately zero. Since the feedback current is in proportion to the measurement target magnetic field Hm in this example, a value of the measurement target magnetic field Hm may be measured by detecting the feedback current. Additionally, since the magnetic field effectively applied to the magnetism detector 10 is approximately zero, it is possible to use the magnetic field detection device 100 in a region where the external magnetic field (i.e., the measurement target magnetic field) [mT] is in proportion to the output voltage [V/V], regardless of the magnitude of the measurement target magnetic field Hm.

In at least one of the foregoing embodiments or modification examples, the spin injection layer 22 may have the magnetization J22 oriented in the −Y direction that is opposite to the direction of the bias magnetic field generated by the permanent magnets 2A to 2D or the like, as illustrated in FIG. 1B. Embodiments of the technology, however, should not be limited thereto. For example, the spin injection layer 22 may have the magnetization J22 oriented in the +Y direction that is the same as the direction of the bias magnetic field generated by the permanent magnets 2A to 2D or the like. In this case, a spin torque enhancing the intensity of the bias magnetic field oriented in the +Y direction and exerted on each of the magnetism detection elements 1A to 1D may be generated by supplying a bias application current from the AC power 5 and the DC power 6 to each of the modulators 20A to 20D. Such a spin torque may also cause the sensitivity modulation of the magnetism detection elements 1A to 1D. Additionally, the direction of the magnetization of the spin injection layer 22 should not be limited to the direction parallel to or opposite to the direction of the bias magnetic field generated by the permanent magnets or the like. The magnetization of the spin injection layer 22 may be oblique in another embodiment of the technology. Note that, however, the spin injection layer having a magnetization parallel to or opposite to the bias magnetic field may allow the spin torque to effectively cause the sensitivity modulation.

Figure 14:
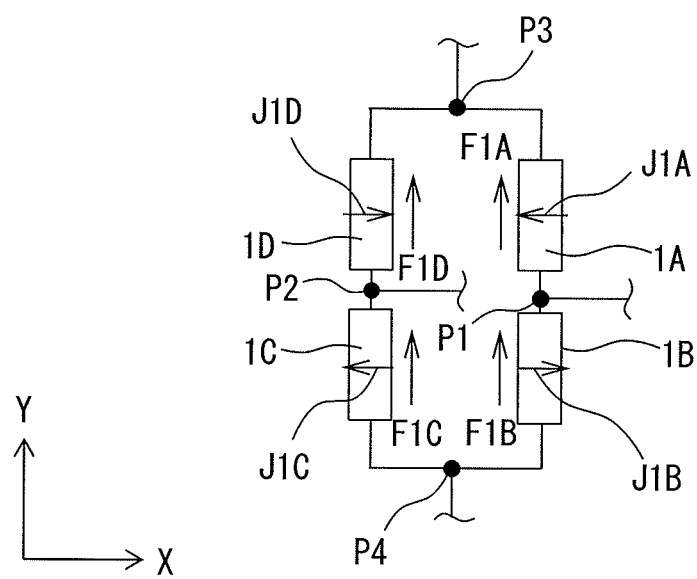
FIG. 14 is a schematic diagram illustrating a portion of the magnetic field detection device according to another modification example of the technology.

In at least one of the foregoing embodiments or modification examples, the permanent magnet is used as the bias magnetic field imparting member. Embodiments of the technology, however, should not be limited thereto. Alternatively, an induction coil may be used as the bias magnetic field imparting member to apply a bias magnetic field to the magnetism detection element through electromagnetic induction. Still alternatively, the bias magnetic field imparting member may not be provided. In such a case, the shape anisotropy between the magnetism detection elements 1A to 1D may be utilized, as illustrated in FIG. 14, for example. For example, the magnetization F1A to F1D of the magnetization free layers 15 may be stabilized in the longitudinal direction (i.e., the Y-axis direction) of the magnetism detection elements 1A to 1D so as to be oriented in a direction orthogonal to the directions (X-axis direction) of the magnetization J1A to J1D of the magnetization fixed layers (or pinned layers) 13 while the external magnetic field is not applied thereto.

It is possible to achieve at least the following configurations from the foregoing embodiments and modification examples of the disclosure.

(1) A magnetic field detection device including:
 a magnetism detection element having a sensitivity axis along a first direction;
 a modulator configured to impart a spin torque to the magnetism detection element, the spin torque having a rotational force and oscillating at a first frequency, the rotational force exerted on a plane including the first direction and a second direction orthogonal to the first direction; and
 a demodulator configured to demodulate an output signal received from the magnetism detection element and to detect an intensity of a measurement target magnetic field exerted on the magnetism detection element on a basis of an amplitude of the output signal, the output signal having the first frequency.
(2) The magnetic field detection device according to (1), in which
 the magnetism detection element is a magnetic tunnel junction element that includes a magnetization fixed layer, a first nonmagnetic layer, and a magnetization free layer,
 the modulator includes a second nonmagnetic layer and a spin injection layer laminated in order, the second nonmagnetic layer being provided on a one face of the magnetization free layer, the one face of the magnetization free layer being opposite to another face of the magnetization free layer on which the first nonmagnetic layer is provided, and
 the magnetism detection element and the modulator are integrated in a single laminate structure.
(3) The magnetic field detection device according to (2), further including:
 a first electrode provided on one face of the magnetization fixed layer, the one face of the magnetization fixed layer being opposite to another face of the magnetization fixed layer on which the first nonmagnetic layer is provided; and
 a second electrode provided on one face of the spin injection layer, the one face of the spin injection layer being opposite to another face of the spin injection layer on which the second nonmagnetic layer is provided, in which
 the spin torque is exerted on magnetization of the magnetization free layer when a bias application current is supplied from the first electrode to the second electrode.
(4) The magnetic field detection device according to (2) or (3), further including a bias magnetic field imparting member configured to impart a bias magnetic field to the magnetism detection element, the bias magnetic field being oriented in the second direction, in which
 the spin injection layer has magnetization oriented in a direction identical to the second direction or opposite to the second direction.
(5) The magnetic field detection device according to any one of (1) to (4), in which the demodulator includes a highpass filter configured to pass a frequency component having a second frequency or higher, the second frequency being lower than the first frequency.
(6) The magnetic field detection device according to (5), in which the demodulator further includes a phase detection circuit configured to obtain a phase detection signal on a basis of a square wave having a phase identical to a phase of the output signal outputted from the magnetism detection element and having the first frequency.
(7) The magnetic field detection device according to (6), in which the demodulator further includes a lowpass filter configured to smooth a measurement target component in the phase detection signal and to pass the smoothed measurement target component.
(8) The magnetic field detection device according to (7), in which the demodulator further includes an analog-digital converter configured to perform analog-digital conversion on the measurement target component having passed through the lowpass filter.
(9) The magnetic field detection device according to (5), in which the demodulator further includes a sample and hold circuit.
(10) The magnetic field detection device according to (9), in which the demodulator further includes an analog-digital converter configured to perform analog-digital conversion on a sample component having passed through the sample and hold circuit.
(11) The magnetic field detection device according to (10), in which the analog-digital converter performs the analog-digital conversion that involves a time averaging process on a plurality of the sample components.
(12) A method of detecting a magnetic field, the method including:
 imparting a spin torque to a magnetism detection element having a sensitivity axis along a first direction, the spin torque having a rotational force and oscillating at a first frequency, the rotational force exerted on a plane including the first direction and a second direction orthogonal to the first direction; and
 detecting an intensity of a measurement target magnetic field exerted on the magnetism detection element on a basis of an amplitude of an output signal outputted from the magnetism detection element and having the first frequency.

According to the magnetic field detection device and the method of detecting a magnetic field of at least one of the foregoing embodiments or modification examples of the technology, the sensitivity is modulated by imparting the spin torque that oscillates at the first frequency. This allows the amplitude of the output from the magnetism detection element to vary depending on the intensity of the measurement target magnetic field. Accordingly, it is possible for the demodulator to detect the intensity of the measurement target magnetic field exerted on the magnetism detection element on the basis of the amplitude of the output from the magnetism detection element.

According to the magnetic field detection device and the method of detecting a magnetic field of at least one of the foregoing embodiments or modification examples of the technology, 1/f noises are effectively removed, which results in highly reproducible measurement of the magnetic field. It therefore is possible for the magnetic field detection device and the method of detecting a magnetic field according to at least one of the foregoing embodiments or modification examples of the technology to achieve higher detection resolution.

It should be understood that effects of the embodiments or modification examples of the technology should not be limited to those described herein and may be other effects.

What is claimed is:
1. A magnetic field detection device comprising:
 a magnetism detection element having a sensitivity axis along a first direction;
 a modulator configured to impart a spin torque to the magnetism detection element, the spin torque having a rotational force and oscillating at a first frequency, the rotational force being exerted on a plane including the first direction and a second direction orthogonal to the first direction; and a demodulator configured to demodulate an output signal received from the magnetism detection element and to detect an intensity of a measurement target magnetic field exerted on the magnetism detection element on a basis of an amplitude of the output signal, the output signal having the first frequency.

2. The magnetic field detection device according to claim 1, wherein the magnetism detection element comprises a magnetic tunnel junction element that includes a magnetization fixed layer, a first nonmagnetic layer, and a magnetization free layer, the modulator includes a second nonmagnetic layer and a spin injection layer laminated in order, the second nonmagnetic layer being provided on one face of the magnetization free layer, the one face of the magnetization free layer being opposite to another face of the magnetization free layer on which the first nonmagnetic layer is provided, and the magnetism detection element and the modulator are integrated in a single laminate structure.

3. The magnetic field detection device according to claim 2, further comprising:

a first electrode provided on one face of the magnetization fixed layer, the one face of the magnetization fixed layer being opposite to another face of the magnetization fixed layer on which the first nonmagnetic layer is provided; and a second electrode provided on one face of the spin injection layer, the one face of the spin injection layer being opposite to another face of the spin injection layer on which the second nonmagnetic layer is provided, wherein the spin torque is exerted on magnetization of the magnetization free layer when a bias application current is supplied from the first electrode to the second electrode.

4. The magnetic field detection device according to claim 2, further comprising a bias magnetic field imparting member configured to impart a bias magnetic field to the magnetism detection element, the bias magnetic field being oriented in the second direction, wherein the spin injection layer has magnetization oriented in a direction identical to the second direction or opposite to the second direction.

5. The magnetic field detection device according to claim 1, wherein the demodulator includes a high-pass filter configured to pass a frequency component having a second frequency or higher, the second frequency being lower than the first frequency.

6. The magnetic field detection device according to claim 5, wherein the demodulator further includes a phase detection circuit configured to obtain a phase detection signal on a basis of a square wave having a phase identical to a phase of the output signal outputted from the magnetism detection element and having the first frequency.

7. The magnetic field detection device according to claim 6, wherein the demodulator further includes a lowpass filter configured to smooth a measurement target component in the phase detection signal and to pass the smoothed measurement target component.

8. The magnetic field detection device according to claim 7, wherein the demodulator further includes an analog-digital converter configured to perform analog-digital conversion on the measurement target component having passed through the lowpass filter.

9. The magnetic field detection device according to claim 5, wherein the demodulator further includes a sample and hold circuit.

10. The magnetic field detection device according to claim 9, wherein the demodulator further includes an analog-digital converter configured to perform analog-digital conversion on a sample component having passed through the sample and hold circuit.

11. The magnetic field detection device according to claim 10, wherein the A/D converter performs the analog-digital conversion that involves a time averaging process on a plurality of the sample components.

12. A method of detecting a magnetic field, the method comprising:

imparting a spin torque to a magnetism detection element having a sensitivity axis along a first direction, the spin torque having a rotational force and oscillating at a first frequency, the rotational force being exerted on a plane including the first direction and a second direction orthogonal to the first direction; and detecting an intensity of a measurement target magnetic field exerted on the magnetism detection element on a basis of an amplitude of an output signal outputted from the magnetism detection element and having the first frequency.

* * * * *